United States Patent [19]

Dahlquist et al.

[11] Patent Number: 5,607,774

[45] Date of Patent: Mar. 4, 1997

[54] RADIATION CURED RADIOGRAPHIC INTENSIFYING SCREEN

[75] Inventors: John C. Dahlquist, Maplewood; Mieczyslaw H. Mazurek, Roseville, both of Minn.

[73] Assignee: Imation Corp., Oakdale, Minn.

[21] Appl. No.: 441,189

[22] Filed: May 15, 1995

Related U.S. Application Data

[62] Division of Ser. No. 319,807, Oct. 7, 1994, Pat. No. 5,520,965.

[51] Int. Cl.⁶ .................................................. B32B 27/20
[52] U.S. Cl. ................ 428/447; 250/484.4; 252/301.36; 428/328; 428/330; 428/428; 428/451; 522/99; 522/172; 524/420; 525/474; 525/477; 525/479
[58] Field of Search .................. 250/484.4; 252/301.36; 428/323, 328, 330, 428, 447, 451; 522/99, 172; 525/474, 477, 479; 524/420

[56] References Cited

U.S. PATENT DOCUMENTS

| | | | |
|---|---|---|---|
| 2,333,641 | 11/1943 | Corwin | 524/420 |
| 3,502,589 | 3/1970 | Newing | 252/301.36 |
| 3,859,527 | 1/1975 | Luckey | 250/581 |
| 3,883,747 | 5/1975 | Murashige et al. | 250/483.1 |
| 4,204,125 | 5/1980 | Fatuzzo et al. | 250/486.1 |
| 4,350,893 | 9/1982 | Takahashi et al. | 250/484.4 |
| 4,394,581 | 7/1983 | Takahashi et al. | 250/484.4 |
| 4,563,539 | 1/1986 | Gornowicz et al. | 556/421 |
| 4,598,207 | 7/1986 | Naruse et al. | 250/484.4 |
| 4,605,712 | 8/1986 | Mueller et al. | 525/474 |
| 4,777,276 | 10/1988 | Rasmussen et al. | 556/419 |
| 5,091,483 | 2/1992 | Mazurek et al. | 525/477 |
| 5,164,224 | 11/1992 | Kojima et al. | 427/65 |
| 5,296,117 | 3/1994 | De Jaeger et al. | 204/181.5 |
| 5,306,367 | 4/1994 | Suzuki et al. | 156/67 |
| 5,411,806 | 5/1995 | Dahlquist | 428/411.1 |

FOREIGN PATENT DOCUMENTS

| | | |
|---|---|---|
| 0175578A2 | 3/1986 | European Pat. Off. . |
| 0328120 | 8/1989 | European Pat. Off. . |
| 0508416 | 10/1992 | European Pat. Off. . |
| 2058465 | 4/1982 | United Kingdom . |

Primary Examiner—D. S. Nakarani
Attorney, Agent, or Firm—Susan Moeller Zerull

[57] ABSTRACT

The present invention describes a method for the manufacture of a phosphor intensifying screen which eliminates the use of solvents and high processing temperatures. The method comprises blending a phosphor in a hardenable system (i.e., that is, as defined herein, a polymerizable or curable system) comprising phosphor in a radiation curable binder composition, coating the phosphor in a radiation curable binder composition onto a substrate, and polymerizing (i.e., hardening) the system by exposure to actinic radiation. The radiation curable binder composition comprises an organopolysiloxane or a mixture of organgpolysiloxanes.

10 Claims, No Drawings

RADIATION CURED RADIOGRAPHIC INTENSIFYING SCREEN

This is a division of application Ser. No. 08/319,807 filed Oct. 07, 1994, now U.S. Pat. No. 5,520,965.

BACKGROUND OF THE INVENTION

1. Field of the Invention

The present invention relates to processes for the manufacture of intensifying screens, particularly intensifying phosphor screens for use in radiographic imaging.

2. Background of the Art

There are at least two critical objectives in the production of radiographic images, particularly in medical radiographic images. One desired aspect of radiographic imaging is the faithfulness of the generated image to the object through which radiation was passed during imaging. Another important aspect, particularly during medical radiographic imaging, is the reduction of the level of exposure of the object (patient) to radiation during the imaging process.

One significant means of reducing the level of X-ray exposure during imaging has been the use of "intensifying screens" during the imaging process. These screens usually comprise phosphors in a binder on a carrier layer. The phosphors absorb X-ray radiation at a higher efficiency than does silver halide which is normally used in the hard-copy output of radiographic images. The phosphors not only absorb X-rays at an efficient rate, but can also phosphoresce (or fluoresce), emitting radiation at a wavelength other than the wavelength of X-rays which the phosphor absorbed. Depending upon the chemical nature and properties of the phosphor, the emitted radiation may be at essentially any wavelength between and including the infrared and ultraviolet wavelengths of the electromagnetic spectrum. Silver halide naturally absorbs radiation in the ultraviolet and near blue wavelengths, and can be spectrally sensitized to efficiently absorb radiation in other portions of the visible and the infrared spectrum. By using an X-ray absorbing phosphor intensifying screen and a silver halide emulsion spectrally sensitized to the wavelength of emission of the phosphor screen, the efficiency of an X-ray imaging system can be greatly enhanced. This allows for the use of lower doses of X-rays during exposure of the object.

The use of such phosphors is well known in the art as exemplified by U.S. Pat. Nos. 3,883,747 and 4,204,125, where there is direct emission of phosphorescent radiation upon X-ray stimulation. Other examples of such phosphors may be found in U.S. Pat. Nos. 3,859,527 and 5,164,224, where there is exposure to X-rays, storage of the absorbed energy by the phosphor, and subsequent stimulation by stimulating radiation to cause the phosphor to emit the stored energy as UV to infrared radiation. These phosphor systems are commercially successful and provide a significant benefit to the radiographic art. In these types of systems, however, there is a trade-off between speed and sharpness. The screen can be made thicker in order to absorb more X-rays and emit more light. Unfortunately, light generated within the screen is scattered by the phosphor grains to a greater extent in thicker screens, thereby reducing the resulting image sharpness recorded on the film. Conversely, to improve sharpness, a thinner screen is desirable, but a thinner screen requires a higher dosage to the patient or object being X-rayed due to reduced X-ray absorbing capability.

Many methods of improving the image quality, particularly the sharpness of images generated from phosphor screens without adversely affecting the sensitivity or speed of the system, have been proposed. Reflective particulates, dyes, pigments and other light affecting materials have been proposed as additives to phosphor layers to improve sharpness as shown in EPO 102 790 (powdered glass), Japanese Application 146,447/1980 (white pigments), Japanese Patent Application 163,500/1980 (colorants), and EPO 175 578 (sputtering or vacuum evaporation of phosphors). The objective of these methods is primarily to provide a high concentration of phosphor in the active layer of the screen and provide a screen of uniform properties. U.S. Pat. No. 5,306,367 produces a storage phosphor screen by dispersing phosphor particles in a thermoplastic binder diluted with a solvent, then coats the mixture, dries to remove the solvent, and compresses the coating at a temperature above the melting point of the binder.

U.S. Pat. No. 5,296,117 deposits phosphor particles in a binder by electrophoretic deposition of a dispersion of the phosphor particles in a solution of polymeric binder. The solution is coated onto a substrate, dried and the phosphor screen thus produced. Each of these types of systems has shown some benefits, but there is still significant room for improvement in the sharpness of radiographic phosphor screens. In particular, elimination of complicated or costly deposition processes, elimination of the use of environmentally harmful solvents, and reduction or elimination of high processing temperatures would be desirable.

Many radiation curable polymer systems are known. However, many of these systems do not provide the properties required of a binder for phosphor particles in intensifying screens. U.S. Pat. No. 5,091,483 discloses radiation curable organopolysiloxanes which may cure to an elastomer or be used in a pressure sensitive adhesive.

SUMMARY OF THE INVENTION

The present invention describes a method for the manufacture of a phosphor intensifying screen which eliminates the need for solvents and high processing temperatures. The invention also encompasses the phosphor screen itself. The method comprises blending a phosphor in a hardenable system (i.e., that is, as defined herein, a polymerizable or curable system) comprising phosphor in a radiation curable binder composition, coating said phosphor in a radiation curable binder composition onto a substrate, and polymerizing or curing (i.e., hardening) said system by exposure to actinic radiation. The radiation curable silicon composition comprises an organopolysiloxane polymer or a mixture of organopolysiloxane polymers at least one of which has the following general formula:

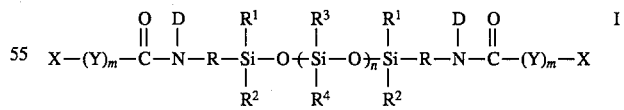

wherein:

X is an organic group having ethylenic unsaturation;

R and Y are independently divalent linking groups;

m is an integer of 0 to 1;

D is selected from hydrogen, an alkyl group of 1 to preferably no more than 10 carbon atoms, and an aryl group of up to 20 carbon atoms;

$R^1$ are monovalent substituents which can be the same or different and are selected from an alkyl group of up to 20 carbon atoms and an aryl group of up to 20 carbon atoms;

$R^2$ are monovalent substituents which can be the same or different and are selected from an alkyl group of up to 20 carbon atoms and an aryl group of up to 20 carbon atoms;

$R^3$ is a monovalent substituent which can be the same or different and is selected from an alkyl group of up to 20 carbon atoms and an aryl group of up to 20 carbon atoms;

$R^4$ is a monovalent substituent which can be the same or different and is selected from an alkyl group of up to 20 carbon atoms and an aryl group of up to 20 carbon atoms; and n is an integer of from about 35 to about 1000.

As is well understood in this area, substitution is not only tolerated, but is often advisable and substitution is anticipated on the compounds used in the present invention. As a means of simplifying the discussion and recitation of certain terminology used throughout this application, the terms "group" and "moiety" are used to differentiate between chemical species that allow for substitution or which may be substituted and those which do not so allow or may not be so substituted. Thus, when the term "group" is used to describe a chemical compound or substituent, the described chemical material includes the basic group and that group with conventional substitution. Where the term "moiety" is used to describe a chemical compound or substituent, only an unsubstituted chemical material is intended to be included. For example, the phrase "alkyl group" is intended to include not only pure open-chain and cyclic saturated hydrocarbon alkyl substituents, such as methyl, ethyl, propyl, t-butyl, cyclohexyl, adamantyl, octadecyl, and the like, but also alkyl substituents bearing further substituents known in the art, such as hydroxyl, alkoxy, vinyl, phenyl, halogen atoms (F, Cl, Br, and I), cyano, nitro, amino, carboxyl, etc. On the other hand, the phrase "alkyl moiety" is limited to the inclusion of only pure open-chain and cyclic saturated hydrocarbon alkyl substituents, such as methyl, ethyl, propyl, t-butyl, cyclohexyl, adamantyl, octadecyl, and the like.

DETAILED DESCRIPTION OF THE INVENTION

Any stimulable or fluorescing phosphor which absorbs X-rays and emits radiation between 200 nm and 1100 nm can be used in the practice of the present invention. Normally those phosphors are to be provided as particulates, particularly with average particle sizes between 0.3 and 50 microns, preferably between 0.5 and 40 microns, more preferably between 0.7 and 35 microns and most preferably between 1 and 30 microns. Amongst the many phosphors known in the art which may be considered in the practice of the present invention are alkali halides, doped alkali halides, rare earth oxy-halides, and others such as are described in U.S. Pat. No. 5,302,423 which is included herein by reference for its disclosure of phosphors. Other literature disclosing phosphors which are contemplated within the scope of the present invention include U.S. Pat. Nos. 4,258,264; 4,261,854; 5,124,564; 4,225,653; 4,387,141; 3,795,814; 3,974,389; 4,405,691, and the like.

The radiation curable binder compositions useful in this invention cure rapidly, completely, and reliably to form a translucent or transparent binder upon exposure to UV radiation. The binders may have to be particularly selected for use with individual phosphors as some polymerizable materials may react with active components in the phosphor, reducing or destroying the efficiency of the phosphor in absorbing and emitting radiation. The binder systems comprise at least one organopolysiloxane according to Formula I and preferably comprise a combination of a low molecular weight organopolysiloxane, preferably having a molecular weight less than about 20,000, more preferably less than 15,000, and a high molecular weight organopolysiloxane, preferably having a molecular weight of more than about 20,000, more preferably more than 25,000. The precise molecular weight divisions vary amongst the organopolysiloxanes within the scope of Formula I.

The blending of high and low molecular weight difunctional organopolysiloxane may allow controlled variation of properties. Desired properties can be obtained via variation in the nature, molecular weight, and amount of the material added. In fact, the blending of the high molecular weight and low molecular weight difunctional organopolysiloxanes provides beneficial synergistic effects on mechanical properties of the cured material. When blending the high and low molecular weight organopolysiloxanes, a compatibilizer may be used if necessary.

Preferably, the weight ratio of low molecular weight difunctional organopolysiloxane to high molecular weight difunctional organopolysiloxane in the hardenable coating composition is in the range of from 10:90 to 90:10, more preferably from 30:70 to 70:30. High concentrations of low molecular weight difunctional organopolysiloxane yield materials with a higher crosslink density (low molecular weight between crosslinks) and may give less desirable mechanical properties. Too much low molecular weight organopolysiloxane may also create difficulties in coating the binder/phosphor blend, e.g. a tendency to have voids or pinholes.

As an alternative to the low molecular weight difunctional organopolysiloxane, a monofunctional siloxane macromolecular monomer may be used. See U.S. Pat. No. 5,091,483, incorporated herein by reference.

The organopolysiloxanes have been chemically tailored to contain terminal functionality which provides rapid and complete cure even at high molecular weight, thereby overcoming the molecular weight limitations of prior art radiation-cured systems. Thus, an important feature of the invention is the use of organopolysiloxane, radiation curable binder systems having terminal groups which not only contain ethylenic unsaturation (so as to be free-radically polymerizable) but which, in addition, possess both hydrogen bond donor and acceptor capabilities. The use of such groups enables rapid and complete cure, such that prior art problems with stability of properties are also overcome, and renders achievable the uniform cure of thick films. Such groups additionally enable careful regulation of crosslink density. Other advantages of the silicone compositions of this invention include ease of preparation, ease of processing (which reduces or even eliminates the need for solvent), and as radiation-curable systems, the ability to cure without damage to heat-sensitive substrates.

The silicone composition of the invention is represented by Formula I. An example of a preferred organolysiloxane comprises the organopolysiloxane of Formula I wherein X comprises Y comprises

m=1; D=H; R comprises —CH$_2$CH$_2$CH$_2$—; and R$^1$, R$^2$, R$^3$ and R$^4$ each comprise —CH$_3$.

Acrylamidoamidosiloxane (herein also referred to as ACMAS) is another preferred embodiment. According to this embodiment ACMAS as defined by Formula I has X comprising CH$_2$=CH—; Y comprising

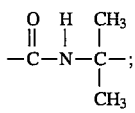

m=1; D=H; R comprising —CH$_2$CH$_2$CH$_2$—; and R$^1$, R$^2$, R$^3$ and R$^4$ each comprising —CH$_3$.

Another preferred organopolysiloxane comprises the organopolysiloxane of Formula I wherein X comprises CH$_2$=CH—; m=0, D=H, R comprises —CH$_2$CH$_2$CH$_2$—; and R$^1$, R$^2$, R$^3$ and R$^4$ each comprise —CH$_3$.

The silicone binder compositions of this invention comprise terminally difunctional, i.e., telechelic, silicones represented by Formula I above, which can be prepared by reaction of an organopolysiloxane diamine, represented by the general formula

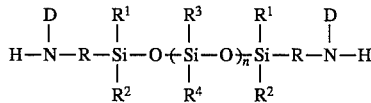

where n, R, R$^1$, R$^2$, R$^3$, R$^4$, and D are as defined above, with an electrophile having ethylenic unsaturation, X, and such other functionality that, upon reaction with the organopolysiloxane diamine, not only a terminal X group but also an amide, urea, or urethane moiety is provided. Examples of the types of functionality required in such electrophilic compounds include acid halide, acid anhydride, and cyclic anhydride (such as the azlactone ring), each of which provides an amide moiety upon reaction with the diamine, and isocyanate, which provides a urea moiety.

Preferably, X comprises

wherein R$^5$ is selected from the group consisting of hydrogen and —COOH and R$^6$ is selected from the group consisting of hydrogen, methyl, and —CH$_2$COOH. Most preferably, R$^5$ comprises hydrogen and R$^6$ is selected from the group consisting of hydrogen and methyl. The reaction of the organopolysiloxane diamine and the electrophile, X, can be carried out at temperatures of about −10° C. to about 50° C. and under atmospheric pressure by combining the diamine and the electrophile while providing appropriate mixing. A non-reactive organic solvent can be used as a diluent but is not necessary, and the two reactants can be charged to the reaction vessel in any order. Alternatively an organopolysiloxane diamine according to Formula II above can be reacted first with a compound containing the two electrophilic groups, e.g., a diisocyanate, (or with a compound such as phosgene) and the resultant product reacted in a second step with a nucleophile, e.g., an amine or an alcohol, to provide terminally difunctional silicone according to Formula I. When an alcohol such as hydroxyethyl acrylate, hydroxyethyl methacrylate, hydroxypropyl methacrylate is utilized, the product organopolysiloxane contains urethane moieties.

Organopolysiloxane diamines useful in the preparation of the telechelic silicones of this invention can be prepared in various ways. See U.S. Pat. No. 5,091,483, incorporated herein by reference. One preferred method for preparation of organopolysiloxane involves running the reaction in two stages utilizing a minimum amount of an essentially anhydrous amino alkyl functional silanolate catalyst represented by the general formula

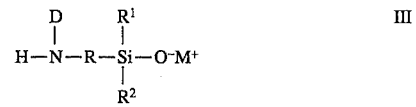

where D, R, R$^1$ and R$^2$ are as defined above and M$^+$ is a cation selected from the group consisting of K$^+$, Na$^+$, and tetraorganoammonium ion, with N(CH$_3$)$_4^+$ being preferred. In the first stage of the reaction, a low molecular weight organopolysiloxane diamine, represented by the general formula

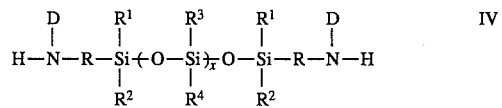

where D, R, R$^1$, R$^2$, R$^3$, and R$^4$ are as defined above and x is an integer of about 4 to about 40, is prepared by reacting an amine functional disiloxane endblocker represented by the general formula

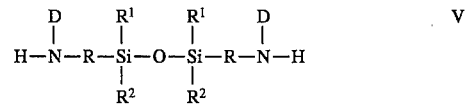

where D, R, R$^1$ and R$^2$ are as defined above with a cyclic organosiloxane represented by general formula

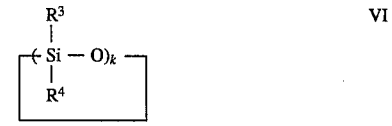

where R$^3$ and R$^4$ are as defined above and k is a positive integer of 3 to 8 in the presence of a catalytic amount of essentially anhydrous amino alkyl functional silanolate represented by Formula III in an inert atmosphere such as nitrogen or argon. The preferred catalyst for use in this reaction is 3-aminopropyl dimethyl tetramethylammonium silanolate, which can be obtained as a crystalline solid from the reaction of one molar equivalent of 1,3-bis(3-aminopropyl) tetramethyldisiloxane with two molar equivalents of tetramethylammonium hydroxide pentahydrate in tetrahydrofuran under reflux, followed by drying under vacuum for five hours (0.1 mm) at 60° C. The amount of catalyst employed should be less than about 0.05%, preferably about 0.005 to about 0.03%, by weight of the resultant organopolysiloxane diamine. The reaction can be carried out in bulk at a temperature of 80°–90° C., and under these conditions is usually complete in about 0.5–2 hours, as judged by substantially complete disappearance of the endblocker of the reaction mixture as determined by vapor phase chromatography. The second stage of the reaction involves the slow addition of the remainder of the cyclic organosiloxane required to achieve the desired molecular weight. This addition is preferably carried out dropwise at such a rate that the cyclic organosiloxane is incorporated into the polymer about as fast as it is added, usually in about five to seven hours at the reaction temperature of 80°–90° C. By utilizing this two-stage method with a minimum amount of essentially anhydrous catalyst, organopolysiloxane diamines represented by Formula II above can be consistently prepared having excellent difunctionality with little contamination from monofunctional and non-functional polysiloxane impurities.

Preferred organopolysiloxane diamines for use in preparing the telechelic silicones of this invention are those for which n is an integer of about 35 to about 1000, R is selected from the group consisting of alkylene of one to about twelve carbon atoms, alkylarylene of up to 20 carbons, and arylene of up to 20 carbon atoms, $R^I$ and $R^2$ are independently selected from the group consisting of alkyl of one to about twelve carbon atoms, substituted alkyl of one to about twelve carbon atoms, aryl of up to 20 carbon atoms, and substituted aryl of up to 20 carbon atoms. $R^3$ and $R^4$ are at least 50% methyl with the remainder selected from the group consisting of alkyl of two to about twelve carbon atoms, substituted alkyl of two to about twelve carbon atoms, vinyl, aryl of up to 20 carbon atoms, and substituted aryl of up to 20 carbon atoms, and D is hydrogen. Most preferably, R is alkylene of one to about twelve carbon atoms and $R^1$, $R^2$, $R^3$, and $R^4$ are methyl, as polydimethylsiloxanes are the most readily available and the most inert.

Examples of electrophiles suitable for reaction with organopolysiloxane diamines to produce the telechelic silicones of the invention include but are not limited to isocyanatoethyl methacrylate, alkenyl azlactones such as vinyl dimethyl azlactone and isopropenyl dimethyl azlactone, m-isopropenyl-α, α-dimethyl benzyl isocyanate, and acryloyl ethyl carbonic anhydride. Some electrophiles, e.g., isocyanatoethyl methacrylate, are commercially available, and others can be prepared via literature methods. Alkenyl azlactones and their preparation are described in U.S. Pat. No. 4,777,276 (Rasmussen et al.), the disclosure of which is incorporated herein by reference. Acryloyl ethyl carbonic anhydride can be prepared from ethyl chloroformate and acrylic acid by the method of R. Hatada and H. Kondo given in *Bull Chem. Soc. Japan.* 41 (10), 2521(1968), the disclosure of which is also incorporated herein by reference. Preferred electrophiles include those selected from the group consisting of isocyanatoethyl methacrylate, vinyl dimethyl azlactone, and acryloyl ethyl carbonic anhydride.

The silicone compositions of the invention can, depending upon their viscosity, be coated, extruded, or poured, and rapidly, completely, and reliably radiation cured (even at high molecular weight) by exposure to electron beam, visible, or ultraviolet radiation. Curing preferably should be carried out in as oxygen-free an environment as possible, e.g., in an inert atmosphere such as nitrogen gas or by utilizing a barrier of radiation-transparent material having low oxygen permeability. Curing can also be carried out under an inerting fluid such as water. When visible or ultraviolet radiation is used for curing, the silicone compositions also contain photoinitiator. Suitable photoinitiators include benzoin ethers, benzophenone and derivatives thereof, acetophenone derivatives, camphorquinone, and the like. Photoinitiator is generally used at a concentration of from about 0.1% to about 5% by weight of the total polymerizable composition, and, if curing is carried out under an inerting fluid, the fluid is preferably saturated with the photoinitiator or photoinitiators being utilized in order to avoid the leaching of initiator from the silicone composition. The rapid cure observed for these materials allows for the use of very low levels of photoinitiator relative to the prior art, hence uniform cure of thick sections can be achieved due to deeper penetration of radiation. If desired, the silicone compositions of the invention can also be cured thermally, requiring the use of thermal initiator such as peroxides, azo compounds, or persulfates generally at a concentration of from about 1% to about 5% by weight of the total polymerizable composition. It is preferable that any initiator (thermal or photo-) utilized be soluble in the silicone compositions themselves, requiring no use of solvent. Liquid initiators are especially preferred.

The radiation curable material, when blended with the phosphors in forming the polymerizable compositions used in the practice of the present invention, preferably contains less than 5% each by weight of low molecular weight non-polymerizable organic materials other than phosphors and low molecular weight polymerizable ingredients. These low molecular weight, non-polymerizable materials may be defined as those having a molecular weight of less than 300, and more preferably less than 500, still more preferably less than 2,000, and most preferably having a molecular weight less than 5,000. The low molecular weight polymerizable materials may be defined as having a molecular weight less than 300, preferably less than 500, more preferably less than 1,000, and most preferably less than 2000. Note that photoinitiators present in the composition are not included in determining the total weight for assessing concentrations of lower molecular weight materials.

The intensifying screens of this invention provide high resolution images without a loss of screen speed. How the inventive screen provides these improvements is not fully understood, but it may be a combination of such factors as greater uniformity in the distribution of the binder after polymerization, a higher packing density of the phosphor particles, less redistribution of ingredients within the phosphor layer due to substantial elimination of solvent migration out of the system, and reduced stress on the system by reduction of dimension changes during solidification of the phosphor layer.

Conventional additives to the phosphor layer may be present in the practice of the present invention so long as the additives do not interfere with cure or other desired properties. For example, brighteners; white pigments; reflective particulates; colorants; coating aids; surfactants, especially polymerizable surfactants; antistats; lubricants; and the like may be present within the coating composition and the final phosphor layer. Particularly useful additions to the coating compositions are antistatic agents such as functionalized derivatives of Jeffamine™ antistats as described in U.S. Pat. No. 5,217,767 and property modifying agents such as reactive silicones used as hardness modifiers (available from Th. Goldschmidt AG).

A preferred method for manufacturing the phosphor screens according to the present invention comprises the steps of blending the phosphor and binder (and optional ingredients) to form a coating mixture comprising less than 5% each by total weight of non-polymerizable organic components and polymerizable components having a molecular weight of less than 300 or 500, coating the mixture onto a substrate, optionally covering the substrate with a smooth layer or a microtextured layer thereby forming a laminate or a surface with controlled roughness, polymerizing said composition by exposure to actinic radiation, and stripping any optional cover layer.

The present invention is particularly effective while using microtextured cover sheets, which impart texture to the screen surface when the sheet is removed from the polymerized composition. This microtexturing can serve to prevent "blocking" (i.e., non-uniform sticking) of the screen and X-ray film, by providing a smaller contact surface along with sufficient channels for air bleed during lamination of the screen to the film. Typically, the surface features imparted by texturing range up to 25 microns in height, created by using a microtextured cover sheet with features up to 25 microns in depth.

It is also practical in the present invention to produced 'prestructured' phosphor screens, that is, screens with a built-in raster orientation of the phosphor so that stimulation of the screen, when used in a storage phosphor mode, can be effected by an entire surface irradiation rather than by only a point-by-point irradiation. This can be accomplished by etching the desired pattern of phosphor distribution onto the surface of a carrier element, the usual pattern being columns and rows of closely spaced dots, filling the pattern with the phosphor containing radiation curable compositions of the invention, and radiation curing the composition of the invention within the pattern. The composition may be applied to the patterned surface by conventional coating processes (e.g., curtain coating, roller bead coating, knife edge coating, spin coating, extrusion coating, sheet coating, etc.) and the excess wiped off so that essentially only the pattern and not the flat surface is coated with the composition.

The phosphor screens produced according to the present invention are characterized by a high phosphor grain loading (phosphor to binder ratios in excess of 6:1, preferably greater than 8:1, more preferably greater than 10:1, most preferably in the range from 10:1 to 18:1) and high phosphor packing density in the cured screen.

The procedure for producing the phosphor screens of the present invention can be summarized as being a series of four distinct steps. The components of the photopolymer mixture and the phosphor particles are weighed out and blended together, for example, by successive passes through a commercially available 3-roll mill, such as a paint mill. Typically, several passes of the mixture through the mill are required to homogeneously blend the material. The blended mixture is then dispensed onto a suitable substrate, and a cover sheet is preferably applied over the mixture, producing a laminated or covered structure to protect the material during subsequent processing steps. The cover sheet may be any material which does not bond to the phosphor layer during hardening. Sheets with release coatings thereon (e.g., paper or film with low-adhesion coatings of fluorocarbons) are preferred. It is possible to use a very thin cover sheet which will bond to the phosphor layer and use that as a protective cover layer and/or release surface on the phosphor, but other means of applying such layers are preferred. The laminate is then passed through a series of rollers at ever decreasing gap space, so that the final desired thickness of the phosphor is obtained. The laminate is then cured using radiation and the cover sheet is removed to expose the final phosphor screen. The cover sheet may remain on the surface during exposure if it is transparent, does not bond to the phosphor layer surface, or is intended to bond to the phosphor layer surface.

Trimax™ (3M Company) radiographic screens are designated by grades T2, T6, T16, etc. The lower the "T" number, the higher the resolution, the slower the speed, and the finer the particulate size of the phosphor which makes up the screen. The object in radiography is to minimize the exposure to X-rays (faster speed), while obtaining the highest resolution possible. The comparative examples which will follow compare standard commercial screen performance to the performance of the screens of this invention.

There are several measurements which are made on the X-ray film image during the comparison of the performance of the phosphor screens. The optical density is measured using a commercially available optical densitometer. A silver halide emulsion will develop to some extent without exposure to X-rays, without exposure to any radiation (because of fog centers in the silver halide) or with exposure to X-rays without an associated phosphor layer due to absorption of X-rays by the silver halide grains (fog). The X-ray dosage for comparison of phosphor screens is set to a value to achieve an optical density of "1 over fog" (e.g., if the optical density of a fogged film is 0.24, the dosage will be set to achieve an optical density when using a screen, of 1.24).

The relative speed of the phosphor screen and film combination is a measure of how efficiently the film is exposed to achieve the required optical density, i.e., how much dosage is required. In the examples, this relative speed is the dosage required by a standard screen divided by the dosage required by an inventive screen, to obtain the optical density of "1 over fog."

The CTF (Contrast Transfer Function) is a measurement used in the industry to quantify the resolving power exhibited by the X-ray image. As features to be imaged decrease in size, the scattering of the radiation converted by the phosphor screen becomes more significant. For example, two small features in close proximity will often appear as a larger indistinct feature since the scattering from the phosphor layer merges information from each of the smaller features. The CTF can be used as a way to quantify the qualitative clarity of an X-ray image as practiced by the radiologist. The CTF is a function of line pairs resolved per millimeter, and as used in this discussion, it is defined by (the difference in the optical density of the dark and light areas of the measured line pair) ÷(the difference in the optical density of the dark and light regions of the largest line pair). Optical density measurements used in the determination of the CTF of a film/screen combination are obtained by using a microdensitometer. The maximum CTF is equal to 1.0, and screens with a better resolving power will have a higher CTF.

EXAMPLE PREPARATION OF DIFUNCTIONAL ORGANOPOLYSILOXANES

Difunctional polysiloxanes terminated on both ends with ethylenic unsaturated groups were prepared, having a molecular weights of 35,000 g/mol and 10,000 g/mol. A reactor was purged with nitrogen and was charged with 170 grams of bis-(3-aminopropyl)tetramethyldisiloxane (endblocker) and 858 grams of octamethylcyclotetrasiloxane ($D_4$). The reactor was heated to 80° C. and 5 grams of anhydrous 3-aminopropyl dimethyl tetramethylammonium silanolate (catalyst) was added. The reaction mixture was stirred at 80° C. until the end-blocker disappeared (about 1 hour—checked by GC). A further 26.4 kg of nitrogen-purged $D_4$ was added to the resultant reaction mixture (which consisted of a 1,500 molecular weight polysiloxane with aminopropyl endgroups, cyclic siloxanes and active catalyst) over a period of 5 hours. The reaction mixture was maintained at 80° C. while stirring overnight. Then, the catalyst was decomposed by heating at 150° C. for ½ hour, and the product was stripped at 140° C. and 0.1 mm pressure until no more volatiles distilled (about 5 hours). After cooling the reaction mixture to room temperature, 191 grams of vinyl dimethylazlactone (VDM) was added slowly while stirring, to result in 25 kg (95% solids) acrylamidoamidosiloxane (ACMAS) having a number average molecular weight of 35,000 g/mol (determined by acid titration of silicone diamine before functionalization with VDM).

ACMAS having a 10,000 g/mol molecular weight was made by an analogous procedure, using the following amounts of materials (the only difference being that a different relative amount of D4 was added in the second step of polymerization): 681 grams of end-blocker, 3405 grams of D4, 5 grams of catalyst, 28.4 kg of $D_4$, and 763 grams of VDM.

COMPARATIVE EXAMPLE 1

Trimax™ T2 and Trimax™ T6 phosphor screens (3M Company, St. Paul, Minn.) were exposed conventionally using XD/a+ radiographic film (3M Company, St. Paul, Minn.) and a standard target. The conditions of exposure and resulting measured CTF are summarized below. The exposure of a film without having an associated phosphor screen yielded an optical density of 0.29. The applied dose was adjusted to yield an optical density for all exposures of 1.29 (a "1 over fog" condition).

| Trimax ™ Phosphor Screen | kVp | Dose mR | CTF @2 lp/mm | CTF @4 lp/mm | CTF @6 lp/mm |
|---|---|---|---|---|---|
| T2 | 40 | 3.45 | 0.70 | 0.39 | 0.18 |
| T2 | 60 | 2.137 | 0.6 | 0.33 | 0.15 |
| T2 | 80 | 1.215 | 0.43 | 0.14 | — |
| T6 | 40 | 1.82 | 0.67 | 0.28 | — |
| T6 | 60 | 0.879 | 0.49 | 0.19 | 0.04 |
| T6 | 80 | 0.501 | 0.32 | 0.09 | — |

EXAMPLE 1

A phosphor screen comprising T6 Trimax™ phosphor particles (3M Company, St. Paul, Minn.) and a radiation curable binder, was formulated having a phosphor to binder ratio of approximately 12:1. A mixture of 31.35 grams of T6 Trimax™ phosphor particles; 1.6 grams of acrylamidoamidosiloxane (ACMAS) blend comprising 50 parts by weight of 35,000 molecular weight acrylamidoamidosiloxane, 50 parts by weight of 10,000 molecular weight acrylamidoamidosiloxane with 0.5 parts Darocure™ 1173 (free radical initiator from EM Industries); 0.9 grams of a hardness modifier comprising 25 parts by weight TEGO™ RC726, 25 parts by weight TEGO™ RC711 (both from Th. Goldschmidt AG), and 1 part by weight Darocure 1173 (mixture designated by 711/726/1173); and 0.11 grams of functionalized Jeffamine™ antistat (FX-8 derivative of Jeffamine ED-900, prepared according to the method described in U.S. Pat. No. 5,217,767, perfluorooctanesulfonyl fluoride, having a molecular weight of ~502), was placed in a 3-roll mill. The gap between the first two rolls was adjusted to 0.005 inches (0.127 mm), and the gap between the second and third roll was set to 0.002 (0.051 mm) inches. The rotational speed of the first roll was 3 rpm, the second roll was rotated at 9 rpm, and the third roll at 28.25 rpm. The mixture was passed through this mill 10 times before removing from the mill and spreading onto a 0.007 (0.18 mm) inch thick polyester substrate. A 0.0023 (0.058 mm) inch thick polyester cover sheet was placed over the mixture to form a laminate, which was then passed through a pair of rollers initially gapped to 0.0243 inches (0.06 mm), resulting in a coating thickness within the laminate of 0.015 inches (0.38 mm). The gap between the rollers was then decreased by approximately 0.003 inches (0.076 mm) and the laminate again passed through the rollers to further compress the mixture. This step was repeated until the resulting coating thickness was 0.005 inches (0.127 mm) or 0.004 inches (0.100 mm). The laminate was then cured using ultraviolet light, and the cover sheet removed. A second screen of each thickness was made using the same procedure as above, like screens were placed on opposite sides of a commercial X-ray film (XD/A+ film, 3M company) with the phosphor layer in contact with the film surface, forming a screen/film/screen laminate, and an exposure mask was placed over the top phosphor screen.

| | Exposure Data: | | | | |
|---|---|---|---|---|---|
| kVp std | Dose Mr | Mils Thick Top/Bot | CTF @2 lp/mm | CTF @4 lp/mm | CTF @6 lp/mm | Speed above T2 |
| 40 | 1.126 | 4/4 | 0.64 | 0.32 | — | 3.06 |
| 40 | 1.346 | 5/5 | 0.69 | 0.25 | 0.12 | 2.56 |
| 60 | 0.680 | 4/4 | 0.56 | 0.27 | — | 3.14 |
| 60 | 0.688 | 5/5 | 0.46 | 0.13 | 0.01 | 3.11 |

EXAMPLE 2

A phosphor screen comprising T6 Trimax phosphor particles (3M Company, St. Paul, Minn.) and a radiation curable binder, was formulated having a phosphor to binder ratio of approximately 9:1. The same method as described in Example 1 was used; however, the formulation of the mixture was as follows:

23.5 grams Trimax T6 Phosphor 1.6 grams ACMAS blend as in Example 1

0.9 grams 711/726/1173

0.11 grams functionalized Jeffamine™ antistat

Two different thicknesses of screens were made with this formulation using the procedure outlined in Example 1: one set of screens having a thickness of 0.003 inches (0.076 mm), and another set of screens having a thickness of 0.005 inches (0.127 mm). A screen/film/screen laminate was formed as in Example 1, and exposed to X-rays.

| | Exposure Data: | | | | | |
|---|---|---|---|---|---|---|
| kVp std | Dose Mr | Mils Thick Top/Bot | CTF @2 lp/mm | CTF @4 lp/mm | CTF @6 lp/mm | Speed above T2 |
| 40 | 1.558 | 3/3 | 0.73 | 0.42 | 0.25 | 2.21 |
| 40 | 1.462 | 5/5 | 0.70 | 0.31 | 0.16 | 2.36 |
| 60 | 0.793 | 3/3 | 0.58 | 0.31 | 0.15 | 2.69 |
| 60 | 0.739 | 5/5 | 0.51 | 0.21 | 0.12 | 2.89 |

| kVp std | Dose Mr | Mils Thick Top/Bot | CTF @2 lp/mm | CTF @4 lp/mm | CTF @6 lp/mm | Speed above T6 |
|---|---|---|---|---|---|---|
| 80 | 0.442 | 3/3 | 0.50 | 0.21 | 0.10 | 1.13 |
| 80 | 0.365 | 5/5 | 0.38 | 0.12 | 0.05 | 1.37 |

EXAMPLE 3

A phosphor screen comprising T6 Trimax phosphor particles (3M Company, St. Paul, Minn.) and a radiation curable binder, was formulated having a phosphor to binder ratio of approximately 12:1. The same method as described in Example 1 was used, however, TEGO RC715 was substituted for TEGO RC711, and the rest of the formulation was as follows:

31.2 grams Trimax T6 Phosphor
1.60 grams ACMAS blend as in Example 1
0.9 grams 715/726/1173
0.1 grams functionalized Jeffamine™ antistat One set of screens with this formulation was made using the procedure outlined in Example 1, each screen having a thickness of 0.004 inches (0.11 mm). A screen/film/screen laminate was formed as in Example 1, and exposed to X-rays.

| kVp std | Dose Mr | Mils Thick Top/ Bot | CTF @2 1p/mm | CTF @4 1p/mm | CTF @6 1p/mm | Speed above T6 |
|---|---|---|---|---|---|---|
| | | Exposure Data: | | | | |
| 80 | 0.367 | 4/4 | 0.41 | 0.14 | — | 1.37 |

Comparison of the data of Examples 1–3, with the standard screen data presented in Comparative Example 1 clearly shows that with proper choice of the thickness of the screen and phosphor to binder ratio, at 40 kVp the CTF of the inventive screen is comparable or higher at every resolution (1p/mm) than a T2 screen at over double the speed, and that at 60 kVp the screen has comparable resolution to a T2 screen again at over double the speed. Similar comparisons are made on penetrations of 60 and 80 kVp with a T6 screen, where comparable or higher CTF values are associated with the faster inventive screen.

There is a wide range of variables that can be considered in comparing the performance of the inventive screens herein described, in particular there is a tradeoff between the speed and the resolving power of the screen, and each is dependant on the type and granular size of the phosphor, the phosphor to binder ratio, and the thickness of the screen. It has been shown that the inventive screen described herein exhibits the resolving power of a standard screen while at a much improved speed, or a higher resolving power at the same speed, which in turn leads to a lower dose of X-rays to which a patient is exposed in order to obtain the necessary information required by the physician.

What is claimed is:

1. A phosphor screen comprising particulate phosphors, which absorb x-rays, in a binder on a substrate wherein the phosphor to binder ratio is greater than 6:1 and wherein said binder is a radiation cured product of a radiation curable binder composition comprising at least one organopolysiloxane polymer having the following general formula:

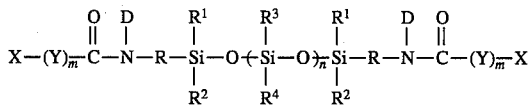

wherein:

X is an ethylenically unsaturated hydrocarbon group;

Y and R independently are a divalent linking groups;

m is an integer of 0 to 1;

D is selected from the group consisting of hydrogen, an alkyl group of 1 to about 10 carbon atoms, and an aryl group of 1 to 20 carbon atoms;

$R^1$ are monovalent substituents which can be the same or different and are selected from an alkyl group and an aryl group;

$R^2$ are monovalent substituents which can be the same or different and are selected from an alkyl group and an aryl group;

$R^3$ is a monovalent substituent which can be the same or different and is selected from an alkyl group and an aryl group;

$R^4$ is a monovalent substituent which can be the same or different and is selected from an alkyl group and an aryl group; and n is an integer of from 35 to 1000.

2. The phosphor screen of claim 1 wherein the radiation curable binder composition comprises a blend of a low molecular weight organopolysiloxane according to Formula I having a number average molecular weight less than 20,000 and a high molecular weight organopolysiloxane according to Formula I having a number average molecular weight greater than 20,000.

3. The phosphor screen of claim 2 wherein the low molecular weight organopolysiloxane has a number average molecular weight less than 15,000 and the high molecular weight organopolysiloxane has a number average molecular weight more than 25,000.

4. The phosphor screen of claim 2 wherein the weight ratio of low molecular weight material to high molecular weight material is in the range of from 10:90 to 90:10.

5. The phosphor screen of claim 2 wherein the weight ratio of low molecular weight material to high molecular weight material is in the range of from 30:70 to 70:30.

6. The phosphor screen of claim 1 wherein said radiation curable binder composition comprises less than 5% by weight of the total composition of organic materials having a molecular weight less than 500.

7. The phosphor screen of claim 1 wherein said radiation curable binder composition comprises less than 5% by weight of the total composition of organic materials having a molecular weight less than 2000.

8. The phosphor screen of claim 1 wherein the organopolysiloxane comprises an acrylamidoamidosiloxane.

9. The phosphor screen of claim 1 wherein said binder further comprises an antistat.

10. A phosphor screen consisting essentially of particulate phosphors in a binder on a substrate wherein said binder is a radiation cured product of a radiation curable binder composition consisting of organopolysiloxane polymers having the following general formula:

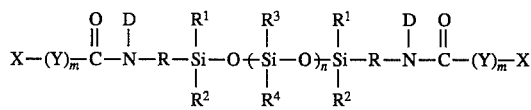

wherein:

X is an ethylenically unsaturated hydrocarbon group;

Y and R independently are a divalent linking groups;

m is an integer of 0 to 1;

D is selected from the group consisting of hydrogen, an alkyl group of 1 to about 10 carbon atoms, and an aryl group of 1 to 20 carbon atoms;

$R^1$ are monovalent substituents which can be the same or different and are selected from an alkyl group and an aryl group;

$R^2$ are monovalent substituents which can be the same or different and are selected from an alkyl group and an aryl group;

$R^3$ is a monovalent substituent which can be the same or different and is selected from an alkyl group and an aryl group;

$R^4$ is a monovalent substituent which can be the same or different and is selected from an alkyl group and an aryl group; and n is an integer of from 35 to 1000.

* * * * *

UNITED STATES PATENT AND TRADEMARK OFFICE
CERTIFICATE OF CORRECTION

PATENT NO.: 5,607,774

DATED: March 4, 1997

INVENTOR(S): Dahlquist et al.

It is certified that error appears in the above-identified patent and that said Letters Patent is hereby corrected as shown below:

On the title page, abstract change "organgpolysiloxanes" should be --organopolysiloxanes--.

Col. 13, line 57, "independently are a divalent" should be --independently are divalent--.

Col. 14, line 47, "are a divalent linking groups" should be --are divalent linking groups--.

Signed and Sealed this

Tenth Day of February, 1998

Attest:

BRUCE LEHMAN

Attesting Officer

Commissioner of Patents and Trademarks